United States Patent [19]

Ross

[11] 4,219,448

[45] Aug. 26, 1980

[54] SCREENABLE CONTACT STRUCTURE AND METHOD FOR SEMICONDUCTOR DEVICES

[76] Inventor: Bernd Ross, 2154 Blackmore Ct., San Diego, Calif. 92109

[21] Appl. No.: 913,872

[22] Filed: Jun. 8, 1978

[51] Int. Cl.² ............................ H01B 1/00; H01B 5/13
[52] U.S. Cl. ...................................... 252/500; 252/512; 252/513; 252/514; 106/1.12; 106/1.13; 106/1.14; 106/1.16; 106/1.17; 106/1.18; 106/1.19; 29/875; 29/885; 75/252; 75/255
[58] Field of Search ............... 252/500, 512, 513, 514; 106/1.12, 1.13, 1.14, 1.16, 1.17, 1.18, 1.19; 29/628, 625, 626, 630 R, 630 A

[56] References Cited

U.S. PATENT DOCUMENTS

| | | | |
|---|---|---|---|
| 3,410,722 | 11/1968 | Flanders et al. | 252/512 |
| 3,684,533 | 8/1972 | Conwicke | 106/1.14 |
| 3,876,433 | 4/1975 | Short | 106/1.14 |
| 4,054,540 | 10/1977 | Michalchik | 252/512 |
| 4,102,722 | 7/1978 | Shoop | 252/514 |

*Primary Examiner*—Brooks H. Hunt
*Attorney, Agent, or Firm*—Lyon & Lyon

[57] ABSTRACT

An ink composition for deposition upon the surface of a semiconductor device to provide a contact area for connection to external circuitry is disclosed, the composition comprising an ink system containing a metal powder, a binder and vehicle, and a metal frit. The ink is screened onto the semiconductor surface in the desired pattern and is heated to a temperature sufficient to cause the metal frit to become liquid. The metal frit dissolves some of the metal powder and densifies the structure by transporting the dissolved metal powder in a liquid sintering process. The sintering process typically may be carried out in any type of atmosphere. A small amount of dopant or semiconductor material may be added to the ink systems to achieve particular results if desired.

12 Claims, No Drawings

SCREENABLE CONTACT STRUCTURE AND METHOD FOR SEMICONDUCTOR DEVICES

BACKGROUND OF THE INVENTION

The present invention relates to structures and methods for forming electrical contact areas on semiconductor devices, whereby such devices may be connected to external circuitry. More particularly, the present invention relates to the formation of such contact areas by screening a metal ink onto the surface of a semiconductor device and subjecting the ink to a firing process in a manner similar to that utilized in thick film technology.

Numerous methods are utilized for metallizing and electrically contacting semiconductor devices. Such methods, used singly or in combination, include thermal compression bonding, vapor deposition, plasma sputtering, electrolytic plating, and electroless plating. These methods often require multiple, repetitive processing steps and the use of quite expensive materials such as gold, palladium, rhodium, platinum and silver. The plating methods raise problems of masking difficulty and poor adhesion as well as front layer metallurgical punch-through in sintering, poor conductivity, variable solderability, and poor moisture stability. The vapor deposition processes often result in a moisture sensitive contact that can degrade as a function of time in normal ambients. The sputtering processes have been difficult to make cost competitive, especially when sintering is required between depositions.

Thick film technology originated in the ceramics industry, wherein precious metal decorative inks such as platinum or gold were screened onto ceramic items and fired to achieve permanence. Thick films are defined as being within the range of 12 $\mu$m (0.005 inches) to 50 $\mu$m (0.002 inches). Thick film technology was introduced into electronics to provide metallization on a ceramic substrate, and later was used to fabricate multilayer chip capacitors; however, it has primarily been directed to deposition upon metal oxide (i.e., ceramic) surfaces rather than upon surfaces that are to be kept relatively free of oxides.

Recently thick film technology has been utilized to create contact areas on semiconductor devices, particularly large devices such as solar cells. Both a grid to act as a front contact and a back contact have been fabricated using conventional thick film techniques. These techniques utilize a metal ink system consisting of a metal powder, a binder and vehicle, and a metal oxide (glass) frit. Typically the metal powder has been silver, sometimes with a small amount of palladium added, and the glass frit has typically been a lead oxide, a bismuth oxide, or a borosilicate. Typical binders and vehicles have been ethyl cellulose and butyl carbitol, respectively; the binder gives the inks cohesion and the vehicle provides the necessary viscosity prior to firing. The ink is screened onto the semiconductor device in the desired pattern by conventional screening techniques, and is then fired at a temperature sufficient to cause the glass frit to become liquid. In the firing process, a portion of the metal powder is dissolved in the liquid frit, and the dissolved metal is then transported to areas of high surface energy such as the negative curvature between undissolved metal particles in contact. This effect causes grain growth and layer shrinkage, resulting in a coherent metal structure wherein the glass frit fills the interstices between cemented metal powder grains.

The above process is typically carried out in an oxidizing atmosphere to remove the binder by oxidation, and at a temperature of 400° C. to 900° C. depending on the melting point of the glass frit. Because it is easily oxidizable, an inexpensive metal such as copper cannot be easily used in such a process, and the surface of the semiconductor device also tends to oxidize and thus create an electrically insulating layer. If the process departs from optimum firing conditions, the glass frit is likely to segregate and migrate to the free surface, making the contact unsolderable, or to the semiconductor surface, increasing the series resistance. Efforts to improve either situation by a hydrofluoric acid dip sometimes cause the contact to fall off the semiconductor surface. Also, such contacts often lack adhesion and cohesiveness, and tend to leach off easily in conventional solders because of the high solubility of silver in tin. Additionally, it is important, particularly in the case of solar cells, that the contact withstand environmental stresses such as moisture, humidity, thermal cycling, vibration, and contamination. Some of the glass frit systems have demonstrated poor resistance to such environmental stresses, particularly moisture.

A metal frit system has been used as the liquid phase medium in a sintering process in the field of powder metal technology for the production of cemented carbides such as tungsten carbide cutting and grinding tools. In this process a metal powder such as tungsten carbide powder is mixed with about six percent by weight of cobalt powder in addition to vehicle and binder. The mixture is then pressed to shape, prefired in hydrogen to remove the binder, and liquid sintered in a vacuum at approximately 1400° C. The cobalt powder, whose melting point is depressed by the dissolved carbon of the tungsten carbide, furnishes the liquid medium. Such use of a metal frit, however, has heretofore been unknown in the field of thick film technology.

SUMMARY OF THE INVENTION

According to the present invention there are provided a metal ink composition and method for fabricating electrical contacts on the surface of a semiconductor device such as a solar cell. The composition comprises screenable conductive metal powder, a binder, a vehicle, and a metal frit preferably having a relatively low melting point. A small amount of an appropriate semiconductor powder may be added to the system to prevent punch-through, as may a small amount of an appropriate dopant to enhance the electrical junction characteristics or to improve the conductivity of the device. Also, a fluxing agent may be added to the system to help insure proper electrical contact by dissolving undesired oxides. The method for applying the metal ink composition follows generally the conventional screening and firing methods of thick film technology, except that the firing may take place at a considerably lower temperature, the precise temperature depending on the metal chosen as the liquid frit medium, and the firing may be performed in other than an oxidizing atmosphere.

Improved adherence and cohesiveness are achieved, and better electrical characteristics result from the absence of insulating material in the ink and the reduced tendency to form oxides either on the semiconductor surface or the metal powder. Less expensive metals may therefore be utilized, and the ability of the contact to withstand environmental stresses is improved. The latter effect is believed possibly to be due to the formation of metal silicides in the sintering process, which tend to create very stable interfaces.

Accordingly, it is an object of the present invention to provide a metal ink composition for deposition upon a substrate, wherein the liquid phase medium is a metal frit.

It is another object of the present invention to provide a reproducible, reliable contact to semiconductor surfaces that can be fabricated on a large area device and yet remain low in cost.

It is a further object of the present invention to provide such a contact having improved electrical characteristics and ability to withstand environmental stresses.

It is another object of the present invention to provide an improved method for sintering a metal ink structure to a semiconductor surface.

It is a still further object of the present invention to provide such a method wherein the sintering may be performed at a lower temperature than heretofore and in any desired atmosphere.

These and further objects and advantages of the present invention will become apparent from the following detailed description of the invention.

DETAILED DESCRIPTION OF THE INVENTION

According to the present invention a metal ink composition for fabricating electrical contacts upon semiconductor devices comprises a conductive metal powder, a binder and vehicle, and a metal frit as a liquid phase medium. The term "metal" in the present context will be understood to include elemental metals as well as alloys and/or combinations thereof, although this may be explicitly set forth hereinafter as well. The metal frit has a relatively low melting point, preferably between 200° and 600° C., and preferably comprises a powder of lead, tin, zinc, or cadmium, and in certain cases, to be discussed in greater detail hereinafter, indium, bismuth, antimony or aluminum and/or alloys or combinations thereof. If a chemically reducing metal is utilized for the metal frit, a better ohmic contact may be achieved by the tendency of the frit to dissolve native oxide on the semiconductor surface. The metal frit preferably constitutes one to ten percent of the ink composition by weight.

Because the above metals have a considerably lower melting point than most glass frits previously utilized, lower firing temperatures are possible. For this reason an oxidizable metal may be used as the metal powder of the system even when sintering is performed in an oxidizing atmosphere. Because it is relatively inexpensive and highly conductive, copper would normally be preferred as the metal powder, although other conductive metals and/or alloys or combinations thereof may be utilized. To achieve a sufficiently low contact resistance to the semiconductor device, the metal chosen should have an electrical resistivity at 0° C. of not more than approximately 7.0 ohm-cm. Firing may also be performed in a neutral atmosphere such as nitrogen or a reducing atmosphere such as forming gas, as will be further described hereinafter.

The binder will preferably be of a type that may be used in either an oxidizing or a reducing atmosphere and that becomes fugitive at a relatively low temperature, such as polyvinyl alcohol (PVA). The vehicle may be any solvent for the particular binder, such as water and ethanol or methanol combined with a small quantity of triethanolamine (TEA) when PVA is the binder. The binder and vehicle together may comprise two to three percent by weight of the total ink structure. It will be apparent that the vehicle should be chosen to be incompatible with any vehicle-binder system that may be present on the substrate, although no such system is normally present in the case of a semiconductor device such as a solar cell. The screen mask emulsion also must be chosen to be incompatible with the ink vehicle.

It may be desirable to include a small amount of semiconductor powder of the same type from which the device is fabricated, such as silicon in the case of a silicon device, to the ink system to prevent metallurgical punch-through of a very thin electrically active layer. Particularly in the case of solar cells, this layer may be on the order of 0.5 $\mu$m or less in thickness, and the prior processes described above involve the risk of partially or completely dissolving this thin layer into the metal ink during the sintering process. This may be avoided by saturating the ink system with the semiconductor powder described above, typically one to two percent of the total ink system by weight, which is believed to help prevent further uptake of semiconductor material from the surface layer.

As mentioned above, in certain cases it may be desirable to utilize such metals as indium, bismuth, antimony or aluminum as the metal frit in a structure according to the present invention. Such materials are particularly useful when it is desired to dope the semiconductor surface layer to enhance N or P type conduction and achieve minimum series resistance, and also can provide a back surface field. Alternatively, such a dopant could be added in small quantities to an ink system containing another metal as the liquid medium.

As a further option, the addition of a very small amount of a fluxing agent to the ink system may be found useful, according to conventional techniques used in ceramics and metallurgy. With respect to the structure of the present invention, such a fluxing agent is preferably of a type tending to dissolve oxides to help insure better electrical contact. For example, the fluxing agent could be a fluoride such as lithium fluoride or cesium fluoride. Another option could involve the addition of a small amount of a metal such as indium or thallium to improve wetting of the liquid metal frit to the metal powder grains.

Application of the metal ink structure to the semiconductor device is performed by conventional screening techniques as set forth above, preferably utilizing a stainless steel wire mesh screen coated with an emulsion mask. An electrical junction will have previously been formed in the device by any conventional process, and the surface of the device will have been cleaned. In the case of solar cells, the ink typically is deposited in a grid pattern on the front of the cell with the lines of the grid spaced apart on the order of 0.5 to 1.0 cm (0.2 to 0.4 inches) and being on the order of 0.2 mm (0.008 inches) in width, the grid further being interconnected by a collecting bar on the edge or in the center of the device for connection to external circuitry by conventional techniques such as soldering, bonding or the like. The ink generally is deposited on the entire back of the device, sometimes leaving a thin ring around the edge. The front and back inks generally are not fired at the same time; rather, one side generally is inked and fired, and the other side is then inked and fired. Simultaneous firing may be performed, however. It will be understood that differently doped inks, if doped inks are employed, may be used on the front and the back of the device, depending upon the electrical characteristics of the semiconductor material on each side.

After the ink is screened onto the semiconductor surface, it is allowed to dry and the device is then fired. The firing for most typical ink structures according to the present invention may be performed at approximately 300° C. for twenty minutes, although the optimum temperature will normally vary with the particular metal used as the liquid phase medium and with the amount thereof present in the composition, and may range from approximately 200° C. to 600° C. At least at the lower temperatures in this range, inexpensive metals such as copper ordinarily will not oxidize sufficiently in air to affect the electrical characteristics of the contact, and it is for this reason, and because of cost considerations as set forth previously, that such metals are preferably employed as the major constituent metal powder. Other such inexpensive metals may include nickel and aluminum. Of course, silver, gold or any other conductive metal, as set forth previously, may be utilized although the costs thereof are greater. Thus it is preferred, from a cost standpoint, to perform the firing, at least in the ower temperature range, in an oxidizing medium such as ordinary air.

In contrast to typical previous glass frit systems, however, an oxidizing atmosphere is not necessary, and if oxidation problems are anticipated, or for any other reason, an appropriately chosen binder such as PVA would allow the firing to be performed in a neutral atmosphere such as nitrogen, which is also relatively inexpensive, or in a reducing atmosphere such as forming gas. A reducing atmosphere may be considered desirable under some circumstances because of the tendency at sufficient temperature to remove native oxide from the semiconductor device or the metal powder and thus help to improve the electrical conductivity of the contact.

During firing, as explained above, a liquid sintering process takes place whereby it is believed that the metal powder, which is dissolved in the liquid frit to beyond its saturation point, redeposits on areas of high surface energy such as the negative curvature between two undissolved metal particles in contact. This causes grain growth and layer shrinkage, resulting in a coherent metal structure. The metallization is normally considered mature when the ink has shrunk to roughly 80 to 95 percent of its theoretical or pure density. The metal frit then becomes a thin matrix, filling the interstices between cemented metal powder grains and dissolved to the limit of its solubility in the regrown portions of the metal grains. If the device is overfired, the major effect will be to cause a larger fraction of the metal frit to be dissolved in this fashion. As opposed to the result when glass frit inks are utilized, this effect will not cause significant changes in the electrical characteristics of the contact because the metal frit is conductive. It is, of course, desired that the sintered structure withstand soldering, and it is believed that the grain structures are sufficiently well interlocked and the amount of interstitial metal frit sufficiently small in volume that contact erosion by soldering will be insignificant.

It will be apparent that there have been provided by the present invention a new and useful screenable contact structure and method for fabricating such a structure, the resulting contact having improved qualities of adherence, cohesiveness and resistance to environmental stresses. While presently preferred embodiments of the structure and method have been described, many variations and modifications thereof would be apparent to those skilled in the art, and it is intended to include all such variations and modifications within the scope of the appended claims.

I claim:

1. A metal powder composition for deposition and firing upon a substrate, comprising
    a screenable metal powder,
    a binder,
    a vehicle, and
    a metal frit for use as a liquid medium to transport the metal powder in a liquid sintering process and thereby create a coherent metal structure.

2. A metal powder composition for deposition and firing upon a substrate, comprising
    a screenable powder of a metal having an electrical resistivity of 7.0 ohm-cm or less at 0° C.,
    a binder,
    a vehicle, and
    a metal frit.

3. A metal powder composition for deposition and firing upon a substrate, comprising
    a screenable powder of a metal having an electrical resistivity of 7.0 ohm-cm or less at 0° C.,
    a binder,
    a vehicle, and
    a metal frit having a melting point approximately in the range of 200° C. to 600° C.

4. A composition according to claim 1, 2 or 3, further including a semiconductor powder.

5. A composition according to claim 1, 2 or 3, further including a dopant selected from the group consisting of N and P type dopants.

6. A composition according to claim 1, 2 or 3, further comprising a fluxing agent.

7. A composition according to claim 1, 2 or 3, wherein the amount of the metal frit is in the range of one to ten percent by weight of the composition.

8. A composition according to claim 1, 2, or 3, wherein the metal powder is selected from the group consisting of copper, nickel, aluminum, silver, and gold, and alloys and combinations thereof.

9. A composition according to claim 1, 2, or 3, wherein the metal frit is selected from the group consisting of lead, tin, zinc, cadmium, indium, bismuth, antimony, aluminum, and alloys and combinations thereof.

10. A composition according to claim 1, 2 or 3, further comprising a fluxing agent selected from the group consisting of fluorides.

11. A metal powder composition for deposition and firing upon a substrate, comprising
    a screenable metal powder selected from the group consisting of copper, nickel, aluminum, silver, gold, and combinations and alloys thereof,
    a binder,
    a vehicle,
    a metal frit selected from the group consisting of lead, tin, zinc, cadmium, indium, bismuth, antimony, aluminum, and combinations and alloys thereof,
    a semiconductor powder,
    a dopant selected from the group consisting of N and P type dopants, and
    a fluxing agent.

12. A composition according to claim 11 wherein the fluxing agent is selected from the group consisting of fluorides.

* * * * *